(12) United States Patent
Lee et al.

(10) Patent No.: US 10,636,995 B2
(45) Date of Patent: Apr. 28, 2020

(54) ORGANIC LIGHT-EMITTING DEVICE

(71) Applicant: LG Display Co., Ltd., Seoul (KR)

(72) Inventors: Jung-Hyoung Lee, Daejeon (KR); Joon-Won Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/199,683

(22) Filed: Nov. 26, 2018

(65) Prior Publication Data
US 2019/0165298 A1    May 30, 2019

(30) Foreign Application Priority Data

Nov. 28, 2017  (KR) .................... 10-2017-0160417

(51) Int. Cl.
*H01L 51/52*       (2006.01)

(52) U.S. Cl.
CPC ...... *H01L 51/5206* (2013.01); *H01L 51/5212* (2013.01); *H01L 51/5221* (2013.01); *H01L 51/5228* (2013.01); *H01L 51/5253* (2013.01); *H01L 2251/5323* (2013.01); *H01L 2251/5361* (2013.01); *H01L 2251/5392* (2013.01)

(58) Field of Classification Search
CPC ............. H01L 51/5206; H01L 51/5221; H01L 51/5228
See application file for complete search history.

(56) References Cited

U.S. PATENT DOCUMENTS

| 2002/0011783 | A1  | 1/2002 | Hosokawa |
| 2017/0084859 | A1* | 3/2017 | Schwamb ........... H01L 51/5203 |
| 2017/0221973 | A1  | 8/2017 | Lee et al. |

FOREIGN PATENT DOCUMENTS

| CN | 1363200 A | 8/2002 |
| CN | 101330131 A | 12/2008 |
| CN | 103779381 A | 5/2014 |
| CN | 107068890 A | 8/2017 |
| EP | 2985803 A1 | 2/2016 |
| EP | 3331039 A1 | 6/2018 |
| JP | 2001-230086 A | 8/2001 |
| JP | 2005-38833 A | 2/2005 |
| JP | 2006-261058 A | 9/2006 |
| JP | 2016-76453 A | 5/2016 |
| JP | 2016-164887 A | 9/2016 |
| JP | 2016-207452 A | 12/2016 |
| TW | 201505159 A | 2/2015 |
| WO | WO 2012/086758 A1 | 6/2012 |
| WO | WO 2017/056814 A1 | 4/2017 |

* cited by examiner

*Primary Examiner* — Jay C Chang
*Assistant Examiner* — Mikka Liu
(74) *Attorney, Agent, or Firm* — Birch, Stewart, Kolasch & Birch, LLP

(57) ABSTRACT

An organic light-emitting device includes a cathode electrode disposed so as to face an anode electrode with an organic layer interposed therebetween, a protective encapsulation layer disposed on the cathode electrode and having a trench, and an upper auxiliary electrode buried in the trench so as to come into contact with the cathode electrode. With this configuration, the organic light-emitting device is capable of reducing resistance of each of the anode electrode and the cathode electrode without damage to the organic layer, thus improving brightness uniformity.

12 Claims, 10 Drawing Sheets

ORGANIC LIGHT-EMITTING DEVICE

This application claims the priority benefit of Korean Patent Application No. 10-2017-0160417, filed on Nov. 28, 2017 in the Republic of Korea, which is hereby incorporated by reference as if fully set forth herein.

BACKGROUND OF THE INVENTION

Field of the Invention

The present invention relates to an organic light-emitting device, and more particularly, to an organic light-emitting device capable of reducing the resistance of an anode electrode and a cathode electrode.

Discussion of the Related Art

An organic light-emitting device (OLED) is a self-illuminating device and does not require a separate light source, and therefore can be manufactured to have a light and thin form. In addition, an organic light-emitting device is advantageous in terms of power consumption due to the low-voltage driving thereof, and is excellent in color implementation, response speed, color viewing angle, and contrast ratio (CR), and therefore has been studied as a next-generation light-emitting device.

In the case in which such an organic light-emitting device is applied to a large-area lighting apparatus, the area of each of an anode electrode and a cathode electrode increases, which causes an increase in the resistance of each of the anode electrode and the cathode electrode. In this case, low brightness uniformity can occur due to the increased resistance of each of the anode electrode and the cathode electrode.

SUMMARY OF THE INVENTION

Accordingly, the present invention is directed to an organic light-emitting device that substantially obviates one or more problems due to limitations and disadvantages of the related art.

The present invention has been provided to solve or address the problems described above, and an object of the present invention is to provide an organic light-emitting device capable of reducing the resistance of an anode electrode and a cathode electrode.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light-emitting device includes a cathode electrode disposed so as to face an anode electrode with an organic layer interposed therebetween, a protective encapsulation layer disposed on the cathode electrode and having a trench, and an upper auxiliary electrode buried in the trench so as to come into contact with the cathode electrode. With this configuration, the organic light-emitting device is capable of reducing the resistance of each of the anode electrode and the cathode electrode without damage to the organic layer, thus preventing or minimizing low brightness uniformity.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Hereinafter, exemplary embodiments according to the present invention will be described in detail with reference to the accompanying drawings.

Figure 1:
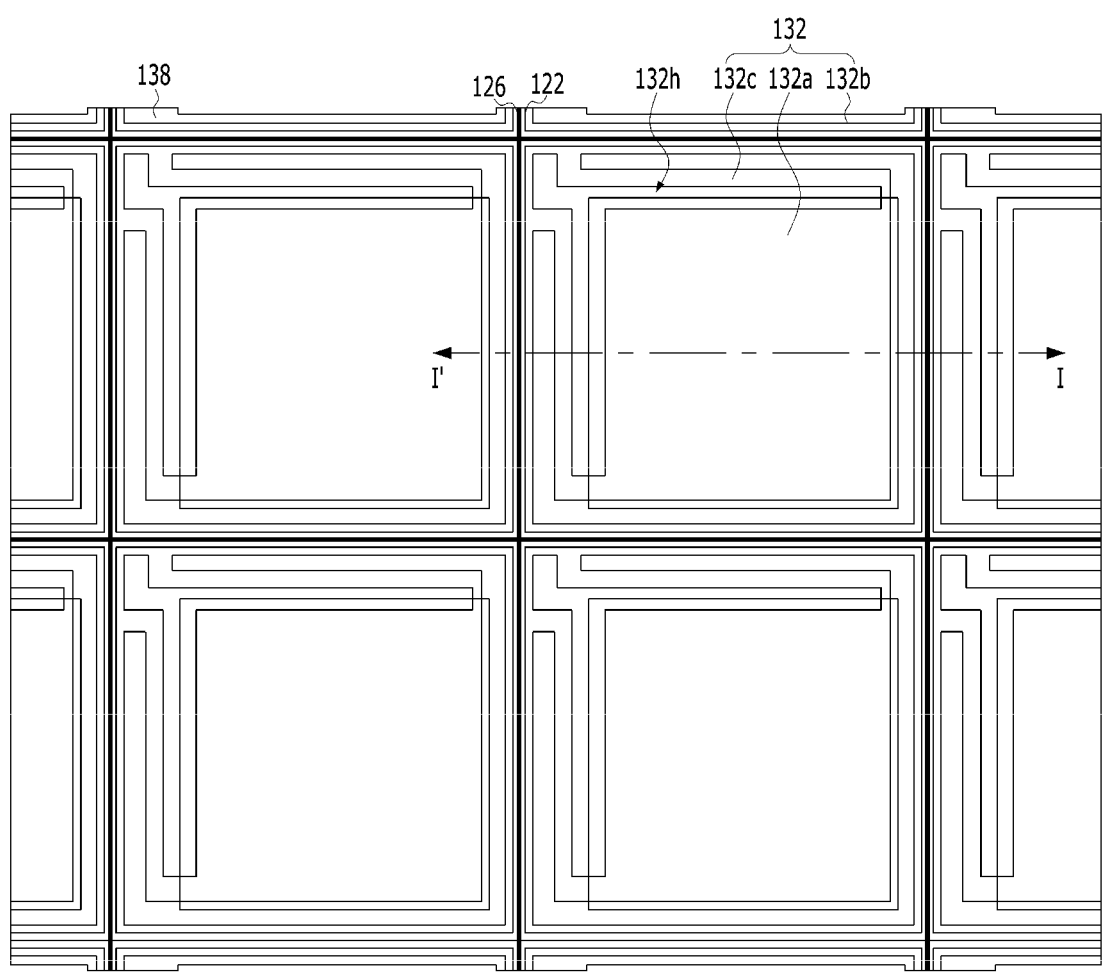
FIG. 1 is a plan view illustrating an organic light-emitting device according to a first embodiment of the present invention.
Figure 2:
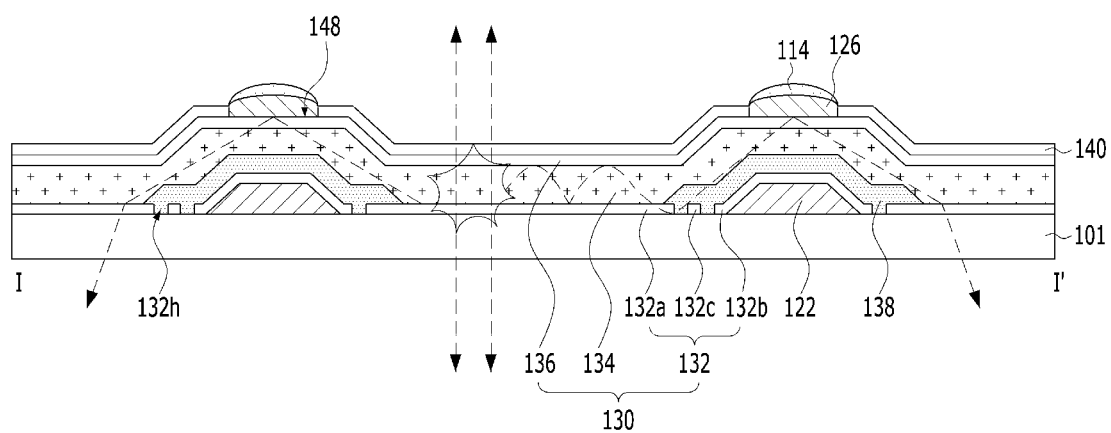
FIG. 2 is a cross-sectional view illustrating the organic light-emitting device of FIG. 1 along line I-I'.
Figure 3:
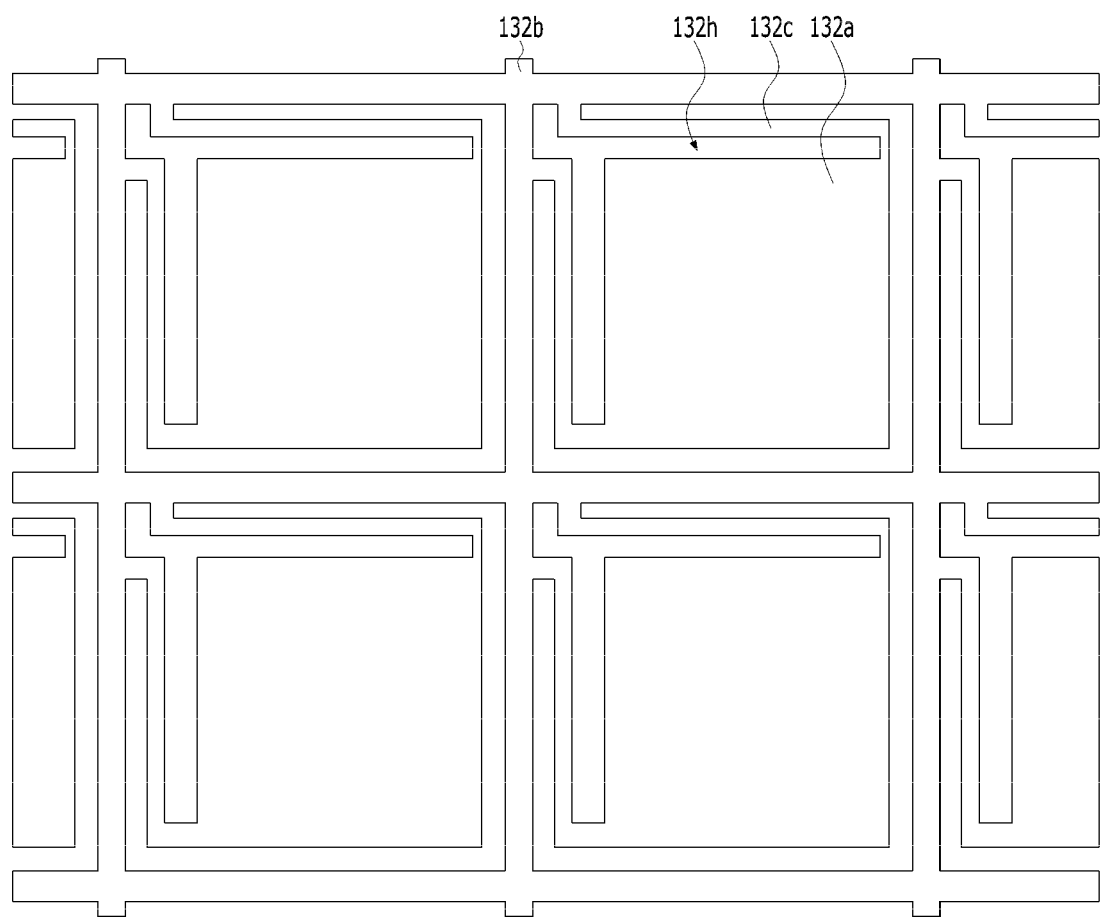
FIG. 3 is a plan view for specifically explaining an example of an anode electrode illustrated in FIG. 1.

FIG. 1 is a plan view illustrating an organic light-emitting device according to an embodiment of the present invention, and FIG. 2 is a cross-sectional view illustrating the organic light-emitting device of FIG. 1 along line I-I'. All the components of the organic light-emitting device according to all embodiments of the present invention are operatively coupled and configured. For instance, each of the organic light-emitting devices described below includes a plurality of pixels each including one or more light-emitting elements. Further, known elements such as driving elements for driving or operating the pixels are part of the present invention.

The organic light-emitting device for a lighting apparatus, illustrated in FIGS. 1 and 2, includes a light-emitting element 130, a pixel insulation layer 138, and a protective encapsulation layer 140, which are disposed on a substrate 101.

The light-emitting element 130 includes an anode electrode 132, an organic layer 134 formed on the anode electrode 132, and a cathode electrode 136 formed on the organic layer 134.

The anode electrode 132 is formed on the substrate 101. The anode electrode 132 is formed of a transparent conductive layer such as indium-tin-oxide (ITO) or indium-zinc-oxide (IZO). The anode electrode 132, as illustrated in FIG.

3, includes an anode portion 132a, a contact portion 132b, and a short-circuit-preventing portion 132c.

The anode portion 132a is an area that overlaps a light-emitting area defined by the pixel insulation layer 138. The anode portion 132a overlaps the cathode electrode 136 with the organic layer 134 interposed therebetween.

The contact portion 132b is formed on a lower auxiliary electrode 122 so as to extend along the lower auxiliary electrode 122. Here, the lower auxiliary electrode 122 is in contact with the anode electrode 132 on the underside of the contact portion 132b of the anode electrode 132 in order to reduce the resistance of the anode electrode 132. To this end, the lower auxiliary electrode 122 is formed of a material having conductivity higher than that of the transparent conductive layer of the anode electrode 132. For example, the lower auxiliary electrode 122 is formed in a single layer or in multiple layers using any one of molybdenum (Mo), aluminum (Al), chrome (Cr), gold (Au), titanium (Ti), nickel (Ni), neodymium (Nd), and copper (Cu), or an alloy thereof. The lower auxiliary electrode 122 is formed in a lattice form along the pixel insulation layer 138 so as to overlap the pixel insulation layer 138.

The short-circuit-preventing portion 132c is located between the contact portion 132b and the anode portion 132a of the anode electrode 132. The short-circuit-preventing portion 132c is spaced apart from each of the contact portion 132b and the anode portion 132a with an anode hole 132h therebetween in a predetermined area. The short-circuit-preventing portion 132c is formed to have a width smaller than those of the contact portion 132b and the anode portion 132a so as to have a resistance value higher than those of the contact portion 132b and the anode portion 132a. Thereby, when a short-circuit defect occurs due to the presence of impurities or the like between the cathode electrode 136 and the anode electrode 132 in a predetermined light-emitting area, the short-circuit-preventing portion 132c prevents current of the light-emitting element 130 in another light-emitting area from leaking through the short-circuit defect.

Since the pixel insulation layer 138 is formed along the lower auxiliary electrode 122 so as to overlap the lower auxiliary electrode 122, the light-emitting area takes the form of an open island. The pixel insulation layer 138 is formed so as to cover the side surface and the upper surface of the lower auxiliary electrode 122 and the side surface of the anode electrode 132. In this case, since the distance between each of the anode electrode 132 and the lower auxiliary electrode 122 and the cathode electrode 136 is increased by the thickness of the pixel insulation layer 138 in the example of the present invention, compared to the related art, it is possible to reduce the occurrence of short-circuit defects between each of the anode electrode 132 and the lower auxiliary electrode 122 and the cathode electrode 136. In addition, since the pixel insulation layer 138 is formed so as to cover the side surface of the anode electrode 132, for example, corrosion of the anode electrode 132 can be prevented. The pixel insulation layer 138 is formed of an organic insulation material having a photoinitiator, for example, photo acryl. The pixel insulation layer 138, formed of an organic insulation material, can be simply formed through a photolithography process without an etching process, whereby the overall process can be simplified.

The organic layer 134 is formed on the anode electrode 132 in the light-emitting area defined by the pixel insulation layer 138. The organic layer 134 is formed by stacking a hole-related layer, an emission layer, and an electron-related layer in this order or in the reverse order on the anode electrode 132. Since the organic layer 134 is simply formed through an application process without a photolithography process using an exposure mask or a deposition process using a fine metal mask, the organic layer 134 is formed below the cathode electrode 136 so as to have an area similar to that of the cathode electrode 136. That is, the organic layer 134 serves as a waveguide since it is continuously formed over the entire surface of the substrate. Light that is generated in and guided through the organic layer 134 is extracted to the rear surface of the substrate 101 by an upper auxiliary electrode 126, which increases luminous efficacy.

The cathode electrode 136 is formed on the organic layer 134 so as to face the anode electrode 132 with the organic layer 134 interposed therebetween. When applied to (or as part of) a transparent lighting apparatus, the cathode electrode 136 is formed of a transparent conductive layer such as indium-tin-oxide (ITO) or indium-zinc-oxide (IZO), similarly to the anode electrode 132.

In order to reduce the resistance of the cathode electrode 136, the upper auxiliary electrode 126 is disposed on the cathode electrode 136 so as to come into contact with the cathode electrode 136. The upper auxiliary electrode 126 is formed of a material having conductivity higher than that of the transparent conductive layer of the cathode electrode 136. For example, the upper auxiliary electrode 126 is formed in a single layer or in multiple layers using any one of molybdenum (Mo), aluminum (Al), chrome (Cr), gold (Au), titanium (Ti), nickel (Ni), neodymium (Nd), and copper (Cu), or an alloy thereof. The upper auxiliary electrode 126 is formed in a lattice form or in a straight line form along the pixel insulation layer 138 and the lower auxiliary electrode 122 so as to overlap the pixel insulation layer 138 and the lower auxiliary electrode 122.

In the case in which the upper auxiliary electrode 126 is in contact with the organic layer 134 below the cathode electrode 136, the organic layer 134 is damaged by an etching solution, a stripping solution, or the like, which is used in the process of manufacturing the upper auxiliary electrode 126. For this reason, since the upper auxiliary electrode 126 is disposed on the cathode electrode 136 and is not in contact with the organic layer 134, it is possible to prevent damage to the organic layer 134 in the process of manufacturing the upper auxiliary electrode 126.

In addition, since the upper auxiliary electrode 126 is formed of an opaque material, the upper auxiliary electrode 126 serves as a reflector. In this case, the upper auxiliary electrode 126 reflects the light that is generated in the organic layer 134 and directed to the upper auxiliary electrode 126, so as to cause the light to be emitted outwards through the substrate 101, which can increase light extraction efficiency.

A protective metal layer 114 is disposed on the upper auxiliary electrode 126 to have the same width as (or substantially the same width as) that of the upper auxiliary electrode 126. The protective metal layer 114 is provided to form a boundary with the protective encapsulation layer 140. The protective metal layer 114 is formed of a material having lower adsorption on an organic polymer layer (e.g., a photoresist), compared to an inorganic insulation material or a metal material. For example, the protective metal layer 114 is formed of $Al_2O_3$. The protective metal layer 114 serves to prevent damage to the upper auxiliary electrode 126 and the organic layer 134 by a solution used in a manufacturing process thereof.

The protective encapsulation layer 140 prevents external moisture or oxygen from being introduced into the organic light-emitting element 130, which is vulnerable to external moisture or oxygen. To this end, the protective encapsulation layer 140 is disposed on the cathode electrode 136 to encapsulate the organic layer 134, which is vulnerable to moisture or oxygen. The protective encapsulation layer 140 includes a trench 148, which exposes the upper surface of the cathode electrode 136, in the area in which the protective encapsulation layer 140 overlaps the lower auxiliary electrode 122. The upper auxiliary electrode 126 is buried in the trench 148 to form a boundary with the protective encapsulation layer 140.

Figure 4:
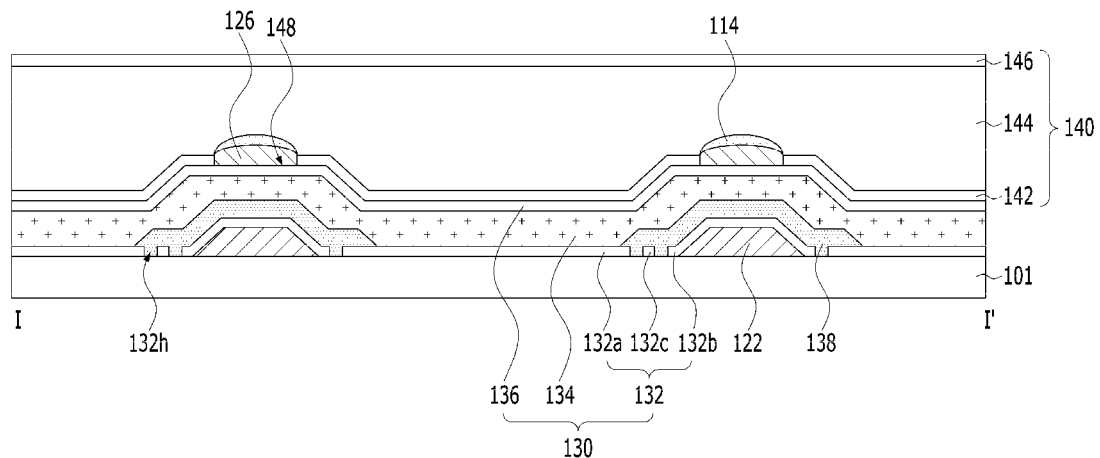
FIG. 4 is a cross-sectional view illustrating another example of a protective encapsulation layer illustrated in FIG. 2.

The protective encapsulation layer 140 can be formed in a single layer, as illustrated in FIG. 2, or can be formed in multiple layers, as illustrated in FIG. 4. FIG. 4 is a cross-sectional view illustrating another example of the protective encapsulation layer illustrated in FIG. 2.

The protective encapsulation layer 140 illustrated in FIG. 4 includes a plurality of inorganic encapsulation layers 142 and 146 and an organic encapsulation layer 144 disposed between the inorganic encapsulation layers 142 and 146, and the inorganic encapsulation layer 146 is disposed in the uppermost layer. Here, the protective encapsulation layer 140 includes at least two inorganic encapsulation layers 142 and 146 and at least one organic encapsulation layer 144. In the present invention, the structure of the protective encapsulation layer 140 in which the organic encapsulation layer 144 is disposed between first and second inorganic encapsulation layers 142 and 146 will be described by way of example. Other examples are possible.

The first inorganic encapsulation layer 142 is formed on the substrate 101, on which the cathode electrode 136 is formed, so as to be closest to the organic light-emitting element 130. The first inorganic encapsulation layer 142 is formed of an inorganic insulation material that enables low-temperature deposition, such as silicon nitride (SiNx), silicon oxide (SiOx), silicon oxide nitride (SiON), or aluminum oxide ($Al_2O_3$). Thereby, since the first inorganic encapsulation layer 142 is deposited under a low-temperature atmosphere, it is possible to prevent damage to the organic layer 134, which is vulnerable to a high-temperature atmosphere during deposition of the first inorganic encapsulation layer 142.

The first inorganic encapsulation layer 142 includes the trench 148, which exposes the upper surface of the cathode electrode 136, in the area in which the first inorganic encapsulation layer 142 overlaps the lower auxiliary electrode 122. The upper auxiliary electrode 126 is buried in the trench 148 to form a boundary with the first inorganic encapsulation layer 142.

The organic encapsulation layer 144 is disposed on the first inorganic encapsulation layer 142 so as to have an area smaller than that of the first inorganic encapsulation layer 142. The organic encapsulation layer 144 is formed of an organic insulation material such as acryl resin, epoxy resin, polyimide, polyethylene, or silicon oxycarbon (SiOC). Thereby, the organic encapsulation layer 144 serves to alleviate stress between the respective layers caused by bending of the organic light-emitting device, and increases planarization performance.

The second inorganic encapsulation layer 146 is formed on the substrate 101 having the organic encapsulation layer 144 formed thereon, so as to cover the upper surface and the side surface of the organic encapsulation layer 144. Thereby, the second inorganic encapsulation layer 146 minimizes or prevents external moisture or oxygen from being introduced into the first inorganic encapsulation layer 142 and the organic encapsulation layer 144. The second inorganic encapsulation layer 142 is formed of an inorganic insulation material, such as silicon nitride (SiNx), silicon oxide (SiOx), silicon oxide nitride (SiON), or aluminum oxide ($Al_2O_3$).

FIGS. 5A to 5H are cross-sectional views for explaining a method of manufacturing the organic light-emitting device illustrated in FIG. 4.

Figure 5A:
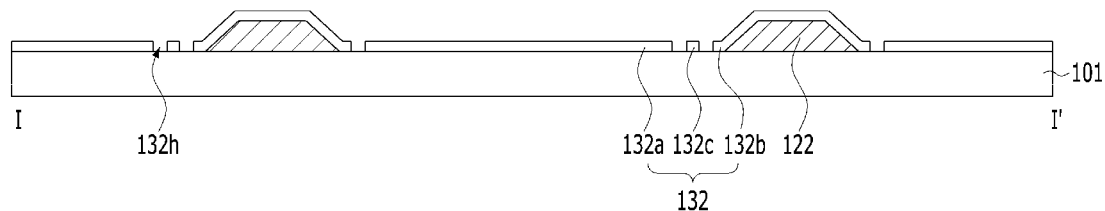
FIGS. 5A to 5H are cross-sectional views for explaining a method of manufacturing an organic light-emitting device illustrated in FIG. 4.

As illustrated in FIG. 5A, after an opaque conductive layer is deposited over the entire surface of the substrate 101, the opaque conductive layer is patterned through a photolithography process and an etching process, so that the lower auxiliary electrode is formed. Subsequently, after a transparent conductive layer is deposited over the entire surface of the substrate 101 having the lower auxiliary electrode formed thereon, the transparent conductive layer is patterned through a photolithography process and an etching process, so that the anode electrode 132, which includes the anode portion 132a, the short-circuit-preventing portion 132c, and the contact portion 132b, is formed.

Figure 5B:
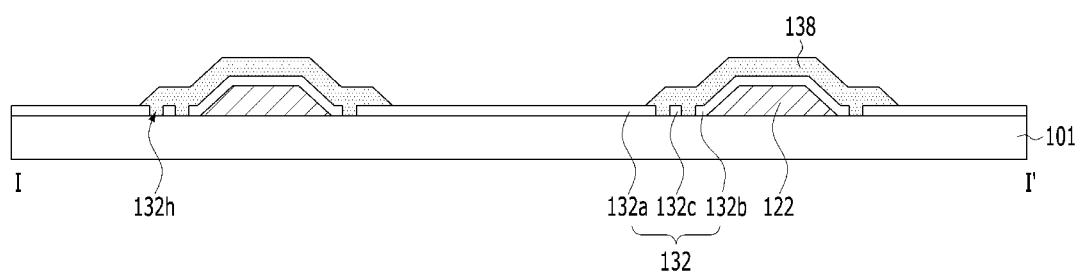

After an inorganic insulation material, such as SiNx or SiOx, is deposited over the entire surface of the substrate 101 having the anode electrode 132 formed thereon, the inorganic insulation material is patterned through a photolithography process and an etching process, so that the pixel insulation layer 138 is formed, as illustrated in FIG. 5B.

Figure 5C:
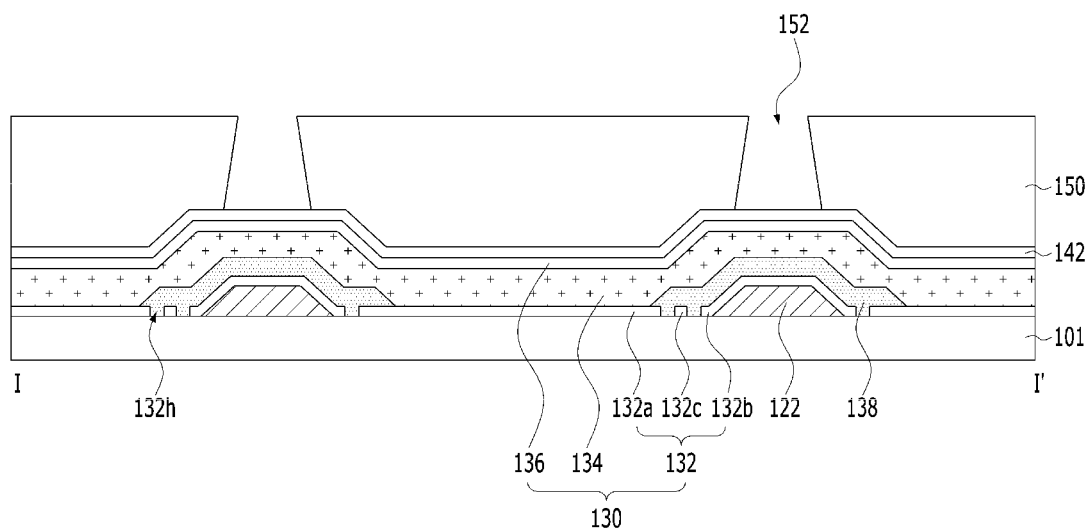

As illustrated in FIG. 5C, the organic layer 134, the cathode electrode 136, and the first inorganic encapsulation layer 142 are sequentially formed over the entire surface of the substrate 101 having the pixel insulation layer 138 formed thereon. Subsequently, after a photoresist is applied on the first inorganic encapsulation layer 142, the photoresist is patterned through an exposure process and a developing process, so that a photoresist pattern 150 having an opening 152 is formed. Here, the opening 152 is located so as to overlap the pixel insulation layer 138, and the side surface of the photoresist pattern 150, exposed through the opening 152, is formed to have an inversely tapered shape.

Figure 5D:
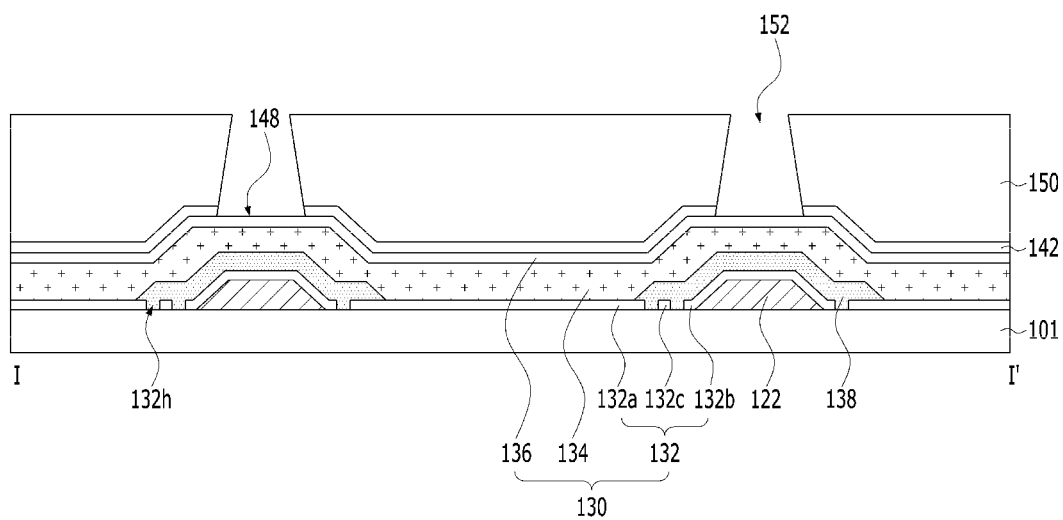

When the first inorganic encapsulation layer 142 is patterned through an etching process using the photoresist pattern 150 as a mask, as illustrated in FIG. 5D, the trench 148 is formed to expose the cathode electrode 136.

Figure 5E:
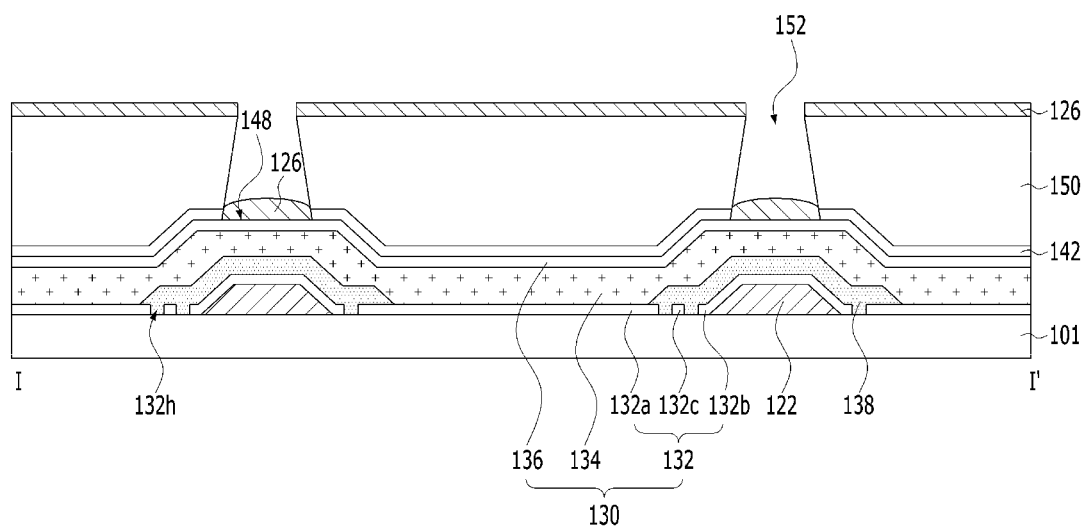

Subsequently, when an opaque conductive layer is deposited over the entire surface of the substrate 101 having the trench 148 formed therein, as illustrated in FIG. 5E, the upper auxiliary electrode 126 is formed on the photoresist pattern 150 and the upper auxiliary electrode 126 is buried in the trench 148. At this time, the upper auxiliary electrode 126 is formed so as to expose the side surface of the photoresist pattern 150.

Figure 5F:
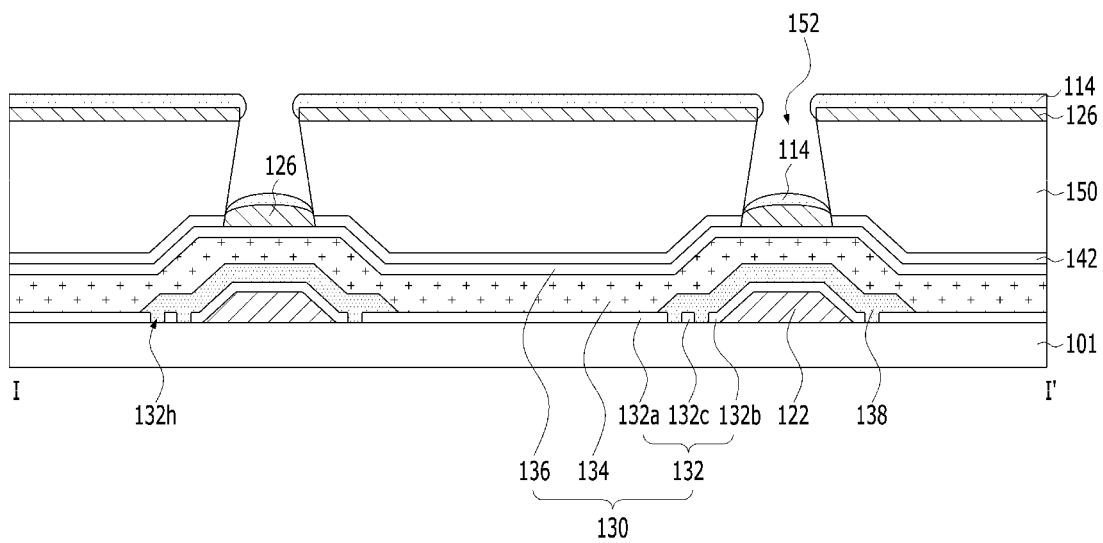

Subsequently, as illustrated in FIG. 5F, the protective metal layer 114 is deposited over the entire surface of the substrate 101 having the upper auxiliary electrode 126 formed thereon. At this time, the protective metal layer 114 is formed of a material having higher adhesion to the upper auxiliary electrode 126 than to the photoresist pattern 150 formed of an organic insulation material. Thereby, the protective metal layer 114 is formed on the upper surface of the upper auxiliary electrode 126, but is not formed on the side surface of the photoresist pattern 150.

Figure 5G:
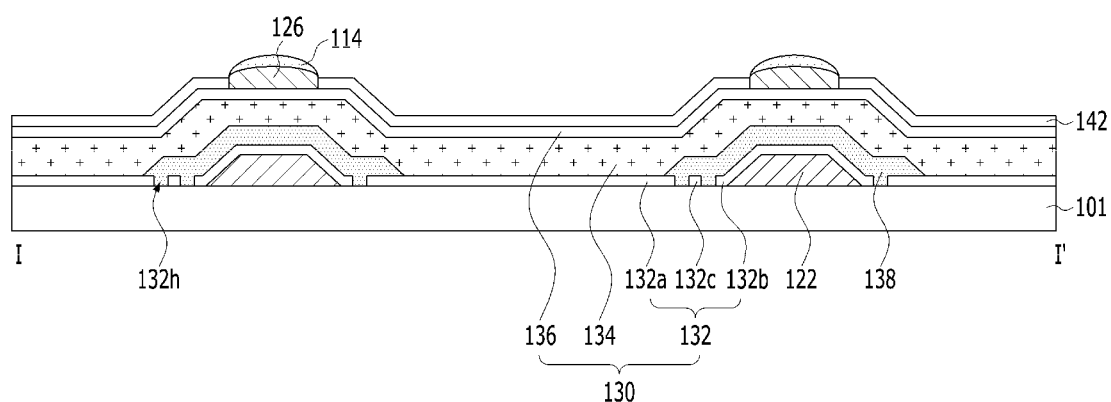

Subsequently, as illustrated in FIG. 5G, the photoresist pattern 150 is removed through a stripping process, so that the upper auxiliary electrode 126 and the protective metal layer 114 disposed on the photoresist pattern 150 are removed. In the stripping process, the side surface of the photoresist pattern 150 is exposed outwards, which enables easy removal of the photoresist pattern 150.

Figure 5H:
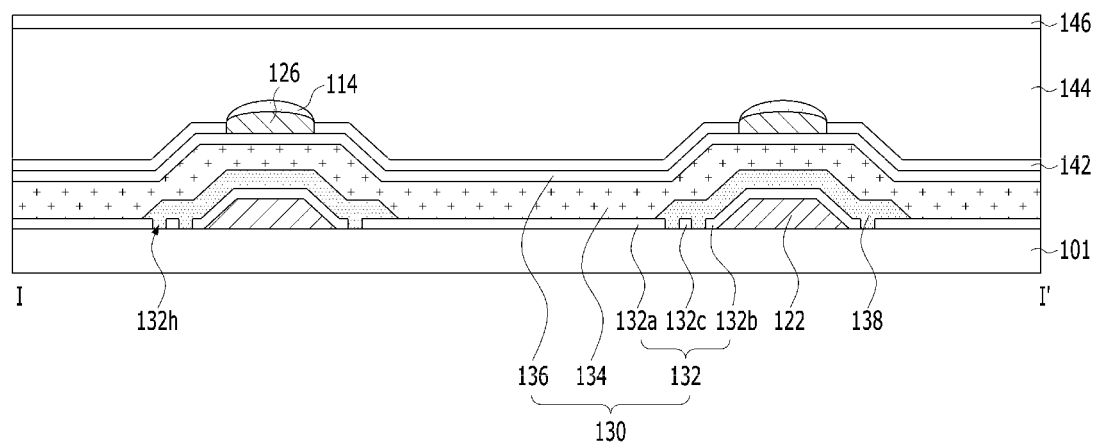

Subsequently, as illustrated in FIG. 5H, the organic encapsulation layer 144 and the second inorganic encapsulation layer 146 are sequentially stacked on the substrate 101 having the protective metal layer 114.

In this way, the organic light-emitting device according to the present invention can simplify the manufacturing process thereof and consequently reduce costs, since the protective metal layer 114 and the upper auxiliary electrode 126 are formed through the same mask process.

Figure 6:
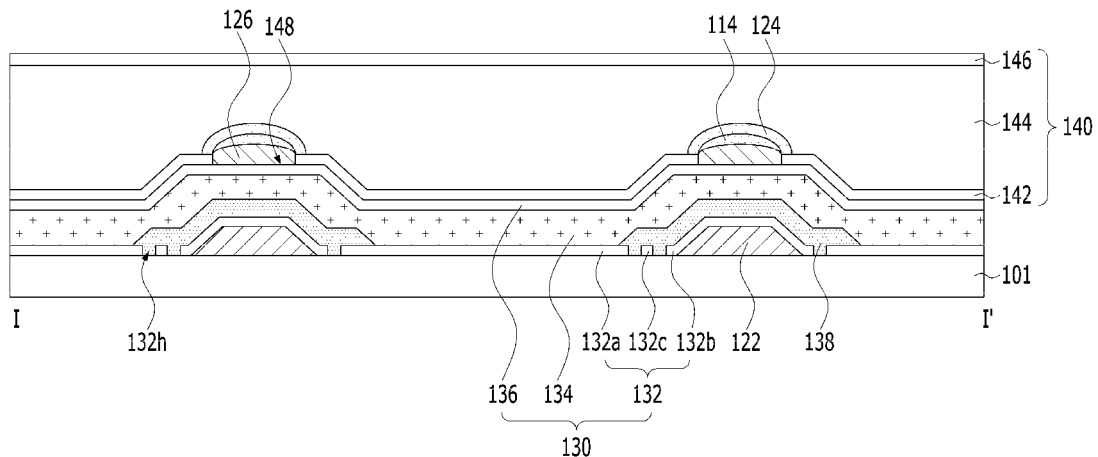
FIG. 6 is a cross-sectional view illustrating an organic light-emitting device according to a second embodiment of the present invention.

FIG. 6 is a cross-sectional view illustrating an organic light-emitting device according to a second embodiment of the present invention.

The organic light-emitting device illustrated in FIG. 6 includes the same (or similar) constituent elements as those of the organic light-emitting device illustrated in FIG. 2, except that it further includes a second protective metal layer 124. Thus, a detailed description related to the same/similar constituent elements will be omitted or will be brief below.

Referring to FIG. 6, the second protective metal layer 124 is disposed on the protective metal layer 114 to have a width larger than that of the protective metal layer 114. Since the second protective metal layer 124 has an area larger than that of the protective metal layer 114, the second protective metal layer 124 is formed so as to cover the side surface of the protective metal layer 114. Thereby, the second protective metal layer 124 is formed so as to cover a gap between the upper auxiliary electrode 126 and the protective metal layer 114, thereby preventing a manufacturing solution (e.g., a washing solution, an etching solution, or a stripping solution) from being introduced into the gap between the upper auxiliary electrode 126 and the protective metal layer 114 during the manufacturing process thereof.

The second protective metal layer 124 is formed of the same material as, or a different material from the protective metal layer 114. For example, the second protective metal layer 124 is formed of $Al_2O_3$, similarly to the protective metal layer 114.

FIGS. 7A to 7D are cross-sectional views for explaining a method of manufacturing the organic light-emitting device illustrated in FIG. 6. It is to be noted that the method of manufacturing the organic light-emitting device illustrated in FIG. 6 up to the formation of the protective metal layer 114 is the same as (or similar to) the method for the organic light-emitting device illustrated in FIG. 2, and thus a detailed description thereof will be omitted or will be brief below.

Figure 7A:
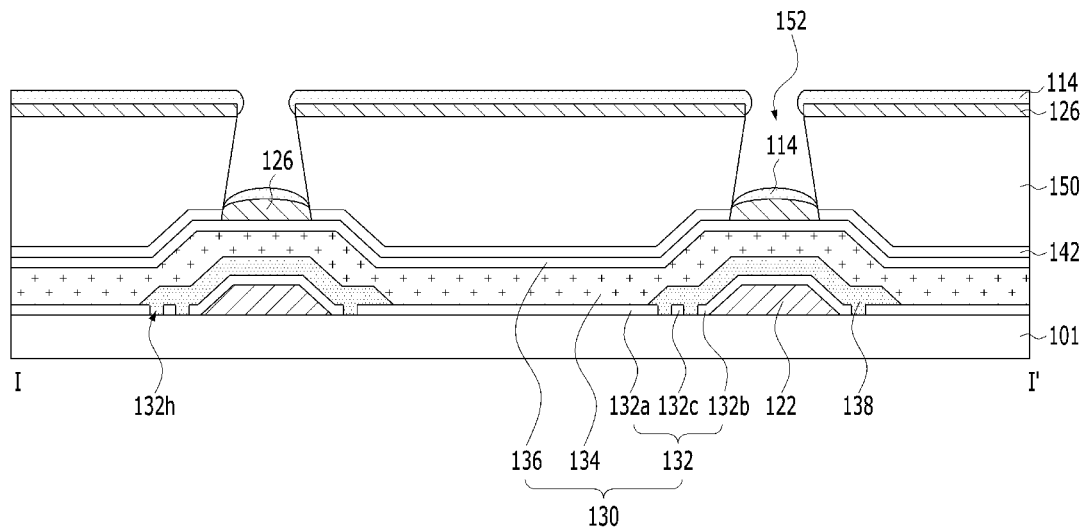
FIGS. 7A to 7D are cross-sectional views for explaining a method of manufacturing the organic light-emitting device illustrated in FIG. 6.

As illustrated in FIG. 7A, the upper auxiliary electrode 126 and the protective metal layer 114 are formed on the substrate 101 via the manufacturing method illustrated in FIGS. 5A to 5H.

Figure 7B:
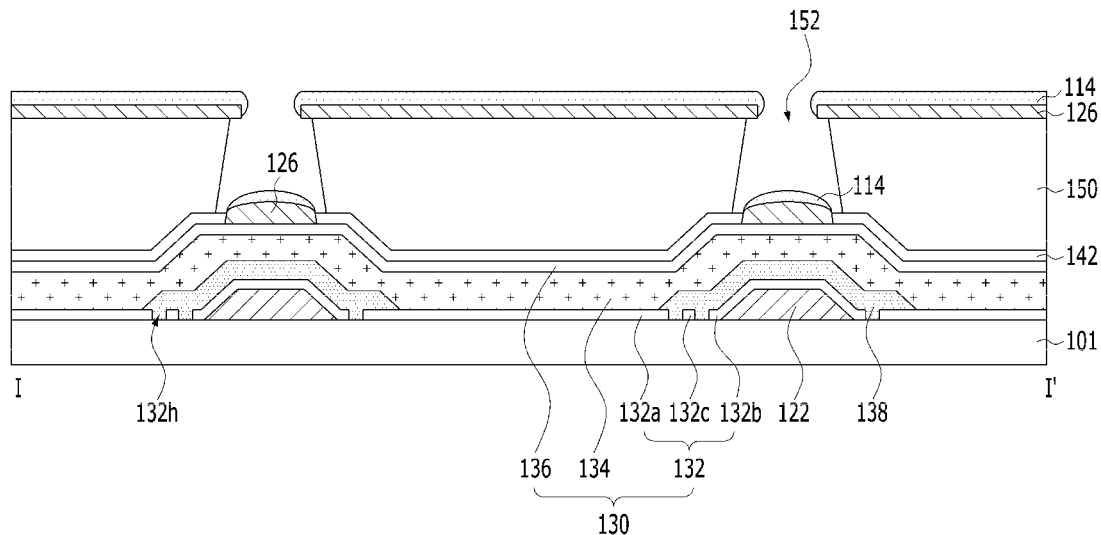

Subsequently, as illustrated in FIG. 7B, the photoresist pattern 150 is etched through an etching process. At this time, excluding the upper surface of the photoresist pattern 150, which is protected by the protective metal layer 114 and the upper auxiliary electrode 126, the side surface of the photoresist pattern 150 is etched. Thus, the opening 152 in the photoresist pattern 150 is wider than that of the protective metal layer 114.

Figure 7C:
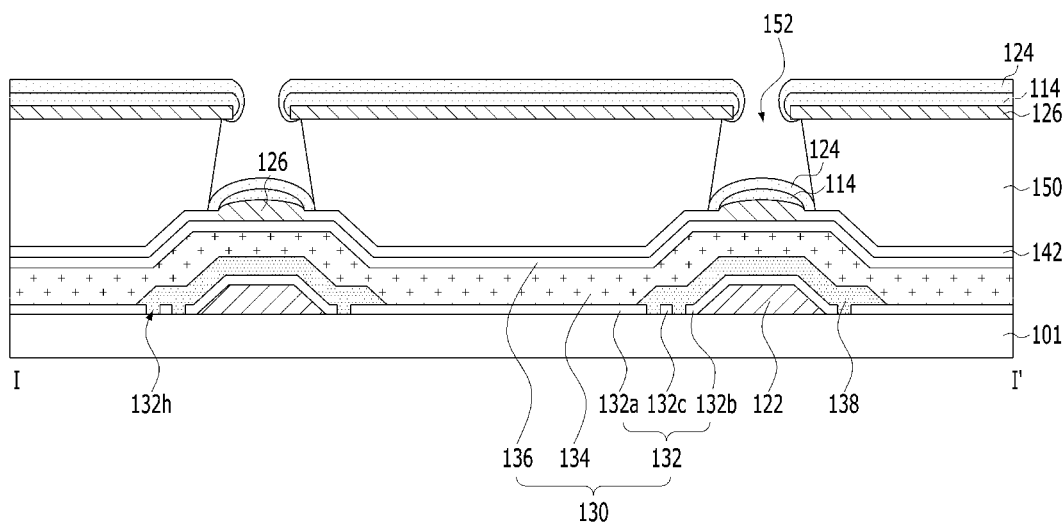

Subsequently, as illustrated in FIG. 7C, the second protective metal layer 124 is deposited over the entire surface of the protective metal layer 114. At this time, the second protective metal layer 124 is formed of a material having higher adhesion to the protective metal layer 114 and the upper auxiliary electrode 126 than to the photoresist pattern 150 formed of an organic insulation material. Thereby, the second protective metal layer 124 is formed on the upper surface of the protective metal layer 114, but is not formed on the side surface of the photoresist pattern 150.

Figure 7D:
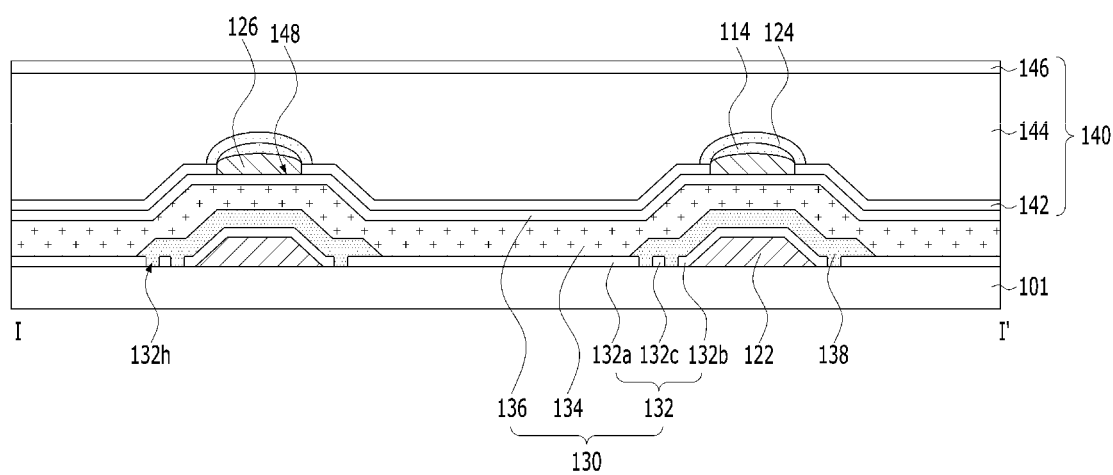

Subsequently, as illustrated in FIG. 7D, by removing the photoresist pattern 150 through a stripping process, the upper auxiliary electrode 126, the protective metal layer 114, and the second protective metal layer 124, which are disposed on the photoresist pattern 150, are removed.

Subsequently, the organic encapsulation layer 144 and the second inorganic encapsulation layer 146 are sequentially stacked on the substrate 101 having the protective metal layer 114 and the second protective metal layer 124 formed thereon.

In this way, the organic light-emitting device according to the present invention can simplify the manufacturing process thereof and consequently, reduce costs since the protective metal layer 114, the second protective metal layer 124, and the upper auxiliary electrode 126 are formed through the same mask process.

As is apparent from the above description, according to the embodiments of the present invention, a lower auxiliary electrode is directly disposed on an anode electrode and an upper auxiliary electrode is directly disposed on a cathode electrode, whereby it is possible to reduce the resistance of each of the anode electrode and the cathode electrode without damage to an organic layer, which can prevent or minimize low brightness uniformity.

In addition, by disposing a protective metal layer on the upper auxiliary electrode, which is buried in a trench in a protective encapsulation layer, in the embodiments of the present invention, it is possible to prevent damage to the organic layer by external moisture, oxygen, or the like. In addition, the upper auxiliary electrode and the protective metal layer are formed through the same mask process, which can result in a simplified structure and reduced manufacturing costs. Moreover, the upper auxiliary electrode serves as a reflective electrode to improve light extraction, which results in increased luminous efficacy.

Although the embodiments of the present invention have been described above in detail with reference to the accompanying drawings, it will be apparent to those skilled in the art that the present invention described above is not limited to the embodiments described above, and various substitutions, modifications, and alterations may be devised within the spirit and scope of the present invention. Thus, the embodiments disclosed in the specification of the present invention are not intended to limit the present invention, and the technical scope of the present invention should be interpreted based on the following claims, and all technical ideas that fall within the range equivalent to the claims should be understood as belonging to the scope of the present invention.

What is claimed is:

1. An organic light-emitting device comprising:
an anode electrode;
an organic layer disposed on the anode electrode;
a cathode electrode disposed to face the anode electrode with the organic layer interposed therebetween;
a protective encapsulation layer disposed on the cathode electrode and including a trench that exposes the cathode electrode, the trench having a width;
an upper auxiliary electrode in the trench to come into contact with the cathode electrode and having a width; and
a lower auxiliary electrode disposed below the anode electrode to come into contact with the anode electrode.

2. The organic light-emitting device according to claim 1, further comprising:

a first protective layer disposed on an upper surface of the upper auxiliary electrode and having a same width as the width of the upper auxiliary electrode and the width of the trench.

3. The organic light-emitting device according to claim 2, wherein the first protective layer is formed of a material having a lower adsorption on an organic polymer layer, compared to an inorganic insulation material or a metal material.

4. The organic light-emitting device according to claim 3, wherein the first protective layer is formed of $Al_2O_3$.

5. The organic light-emitting device according to claim 2, further comprising:
   a second protective layer disposed on the first protective layer and having a width larger than the width of the first protective layer to cover a side surface of the first protective layer.

6. The organic light-emitting device according to claim 5, wherein the first protective layer and the second protective layer include a higher adhesion to the upper auxiliary electrode than an adhesion to an organic insulation material.

7. The organic light-emitting device according to claim 5, wherein the second protective layer is formed of $Al_2O_3$.

8. The organic light-emitting device according to claim 1, wherein the lower auxiliary electrode overlaps the trench.

9. The organic light-emitting device according to claim 1, wherein the protective encapsulation layer includes:
   a first inorganic encapsulation layer disposed on the cathode electrode;
   an organic encapsulation layer disposed on the first inorganic encapsulation layer; and
   a second inorganic encapsulation layer disposed on the organic encapsulation layer, and
   wherein the first inorganic encapsulation layer includes the trench.

10. The organic light-emitting device according to claim 1, wherein the anode electrode includes an anode portion, a contact portion, and a short-circuit-preventing portion disposed between the anode portion and the contact portion.

11. An organic light-emitting device comprising:
   an anode electrode;
   an organic layer disposed on the anode electrode;
   a cathode electrode disposed to face the anode electrode with the organic layer interposed therebetween;
   a protective encapsulation layer disposed on the cathode electrode and including a trench;
   an upper auxiliary electrode in the trench to come into contact with the cathode electrode; and
   a protective layer disposed on an upper surface of the upper auxiliary electrode and having a same width as a width of the upper auxiliary electrode,
   wherein the protective layer is formed of a material having a lower adsorption on an organic polymer layer, compared to an inorganic insulation material or a metal material, and
   wherein the protective layer is formed of $Al_2O_3$.

12. An organic light-emitting device comprising:
   an anode electrode;
   an organic layer disposed on the anode electrode;
   a cathode electrode disposed to face the anode electrode with the organic layer interposed therebetween;
   a protective encapsulation layer disposed on the cathode electrode and including a trench that exposes the cathode electrode, the trench having a width;
   an upper auxiliary electrode in the trench to come into contact with the cathode electrode and having a width; and
   a protective layer contacting an upper surface of the upper auxiliary electrode and having a same width as the width of the upper auxiliary electrode and the width of the trench.

* * * * *